United States Patent
Baker et al.

(10) Patent No.: US 6,468,892 B1
(45) Date of Patent: Oct. 22, 2002

(54) FRONT SIDE COATING FOR BUMP DEVICES

(75) Inventors: Mark Harrison Baker, San Jose, CA (US); Nikhil Kelkar, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/616,475

(22) Filed: Jul. 14, 2000

(51) Int. Cl.[7] .............................................. H01L 21/44
(52) U.S. Cl. ...................................................... 438/612
(58) Field of Search .................................. 257/778, 738, 257/678, 779–784, 737; 438/612–617

(56) References Cited

U.S. PATENT DOCUMENTS

| | | | | |
|---|---|---|---|---|
| 4,666,821 A | | 5/1987 | Hein et al. ................... 430/311 |
| 5,796,586 A | | 8/1998 | Lee et al. ..................... 361/748 |
| 5,903,058 A | * | 5/1999 | Akram ......................... 257/778 |
| 6,075,290 A | * | 6/2000 | Schaefer et al. ............. 257/737 |
| 6,075,710 A | * | 6/2000 | Lau .............................. 174/255 |
| 6,077,765 A | * | 6/2000 | Naya ............................ 438/614 |
| 6,228,687 B1 | * | 5/2001 | Akram et al. ................ 438/108 |
| 6,249,044 B1 | * | 6/2001 | Kao et al. .................... 257/678 |
| 6,268,114 B1 | * | 7/2001 | Wen et al. .................... 430/314 |
| 6,281,106 B1 | * | 8/2001 | Higdon et al. ............... 438/613 |
| 6,312,974 B1 | * | 11/2001 | Wu et al. ..................... 438/107 |

* cited by examiner

Primary Examiner—Hoai Ho
Assistant Examiner—Long K. Tran
(74) Attorney, Agent, or Firm—Beyer Weaver & Thomas, LLP

(57) ABSTRACT

Flip chips with improved solder bump strength are provided. A solder mask layer is placed and patterned on a front side of a wafer of semiconductor chips with semiconductor devices and bond pads. The solder mask is patterned to expose the bond pads. Solder bumps are electrically connected to the bond pads. The solder mask is thick enough to extend up to at least a quarter of the solder bumps and is in contact with the solder bumps. The wafer is then cut into individual chips. The chips may be sold to customers, who may mount the chip on a substrate without underfill.

13 Claims, 6 Drawing Sheets

FRONT SIDE COATING FOR BUMP DEVICES

FIELD OF THE INVENTION

The present invention relates generally to semiconductor production. More precisely the invention relates to improved protection of semiconductor die bonds.

BACKGROUND OF THE INVENTION

To facilitate discussion FIG. 1 is a front side view of a bump device 100 such as a flip chip, used in the prior art. The bump device 100 may comprise a die 102, with a plurality of solder bumps 108 mounted thereon. FIG. 2 is a cross sectional view of the bump device 100 mounted on a substrate 103. The die 102 may have a plurality of aluminum bond pads 104. A passivation layer 105 may be patterned around the aluminum bond pads. An under bump metal (UBM), such as a nickel, copper, etc. may be patterned on the aluminum bond pads 104 to improve bump reliability. Solder bumps 108 may be formed on the UMB and reflowed to mechanically and electrically connect the die 102 to the substrate 103. Thermal stress created by different coefficients of expansion between the die, substrate, and solder bumps may create cracks in the solder bumps near the UMB. In the prior art, after the die 102 is mounted to the substrate 103 an underfill material may be applied between the die 102 and substrate 103 and around the solder bumps 108 to reduce cracks created by thermal stress. Such underfill techniques may require the placement of underfill with each individual die 102 mounted on a substrate 103. Providing underfill individually to each individual die 102 may be expensive and time consuming, and may require accuracy in dispensing the underfill. The substrate 103 may be mounted to a circuit board 107 using a ball grid array. In such ball grid array (BGA) mounts, a solder mask 110 may be placed on a side of the substrate 103 and patterned to expose bond pads 112. A pad coating 114 may be placed over the bond pads 112. Solder bumps 116 may be connected to the pad coating 114. The solder mask 110 may be an organic material, which may be patterned using photo resist. The solder mask 110 may include liquid photo imagable materials. Solder masks are described in U.S. Pat. No. 4,666,821, entitled "Photopolymer For Use As A Solder Mask", by Hein et al. incorporated by reference. In the prior art, such solder masks may be applied to a substrate upon which a die is mounted as described in U.S. Pat. No. 5,796,586, by Lee et al. incorporated by reference or on circuit boards to protect the solder lines. Such solder masks may also be applied to circuit boards to protect solder wiring. For direct chip attach, the bump device is mounted directly to a PC board, so that the PC board is the substrate.

It is desirable to provide protection from thermal stress between a die and a substrate that is less expensive and easier and faster to apply.

SUMMARY OF THE INVENTION

To achieve the foregoing and other objects and in accordance with the purpose of the present invention, a variety of techniques for providing a protective layer for providing an improved flip-chip are described. Generally, chips are created as part of a wafer, wherein each chip has bond pads on a front side of the wafer. A patterned mask layer is patterned over the front side of the wafer, so that the patterned mask layer provides apertures over the bond pads. Electrically conductive connectors are formed on each of the bond pads, so that the patterned mask layer is in contact with at least a quarter of the electrically conductive connector. The chips are then singulated.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set fourth in order to provide a thorough understanding of the present invention. It will be apparent, however, to one skilled in the art, that the present invention may be practiced without some or all of these specific details. In other instances, well-known process steps and/or structures have not been described in detail in order to not unnecessarily obscure the present invention.

Figure 1:
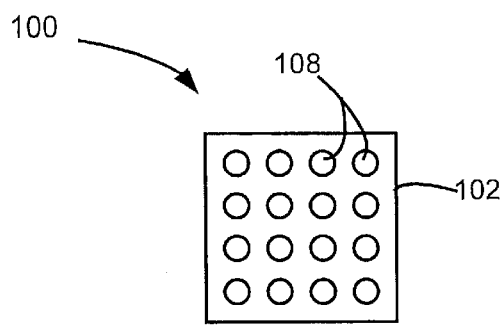
FIG. 1 is a plan view of a flip-chip used in the prior art.
Figure 2:
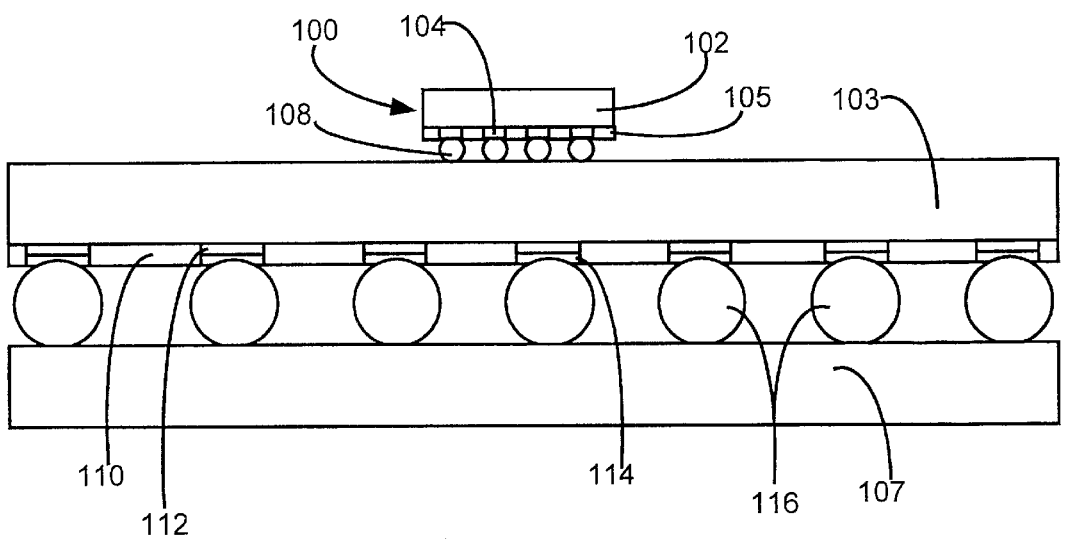
FIG. 2 is a cross-sectional view of a flip chip mounted on a substrate mounted on a circuit board used in the prior art.
Figure 3:
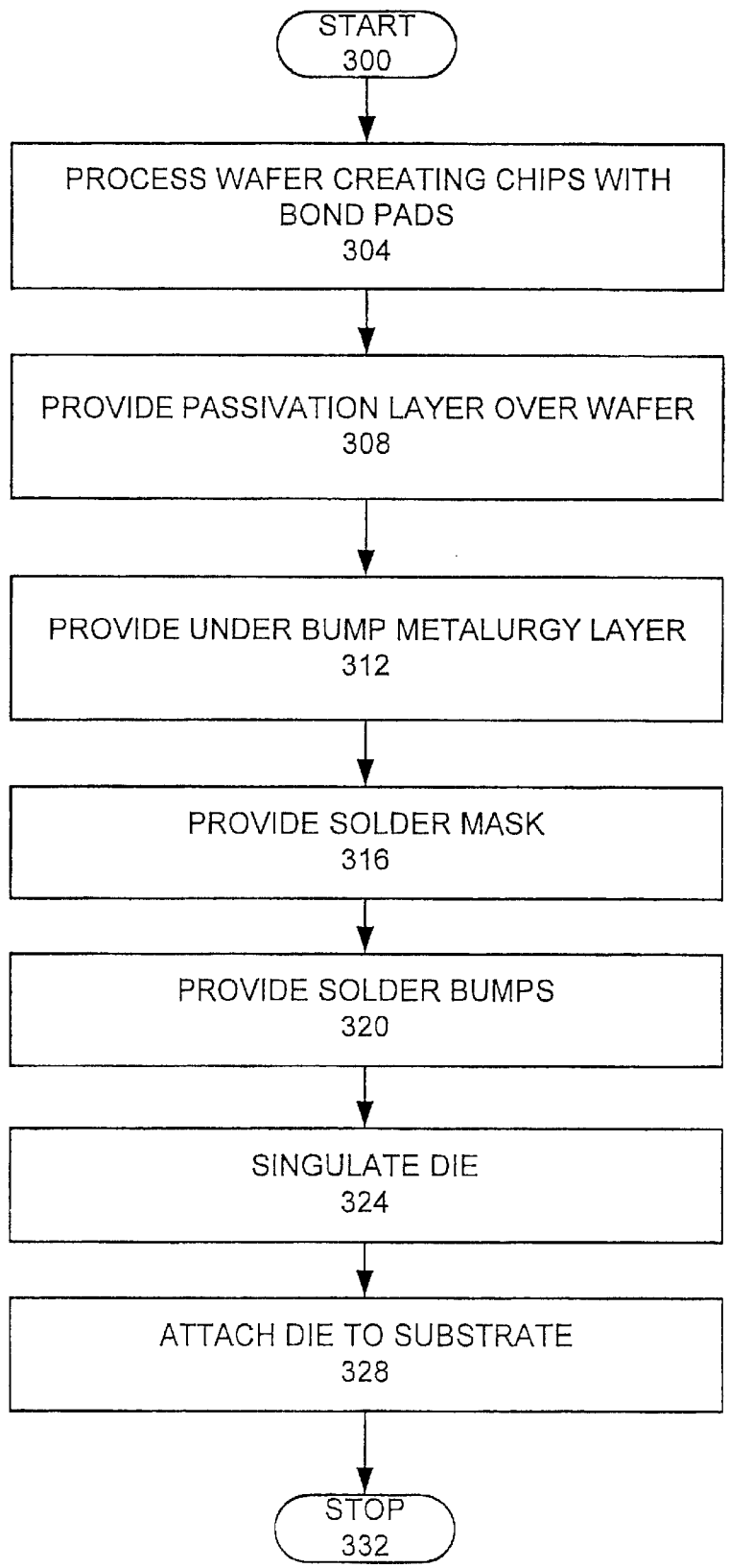
FIG. 3 is a flow chart of a process used in a preferred embodiment of the invention.
Figure 4:
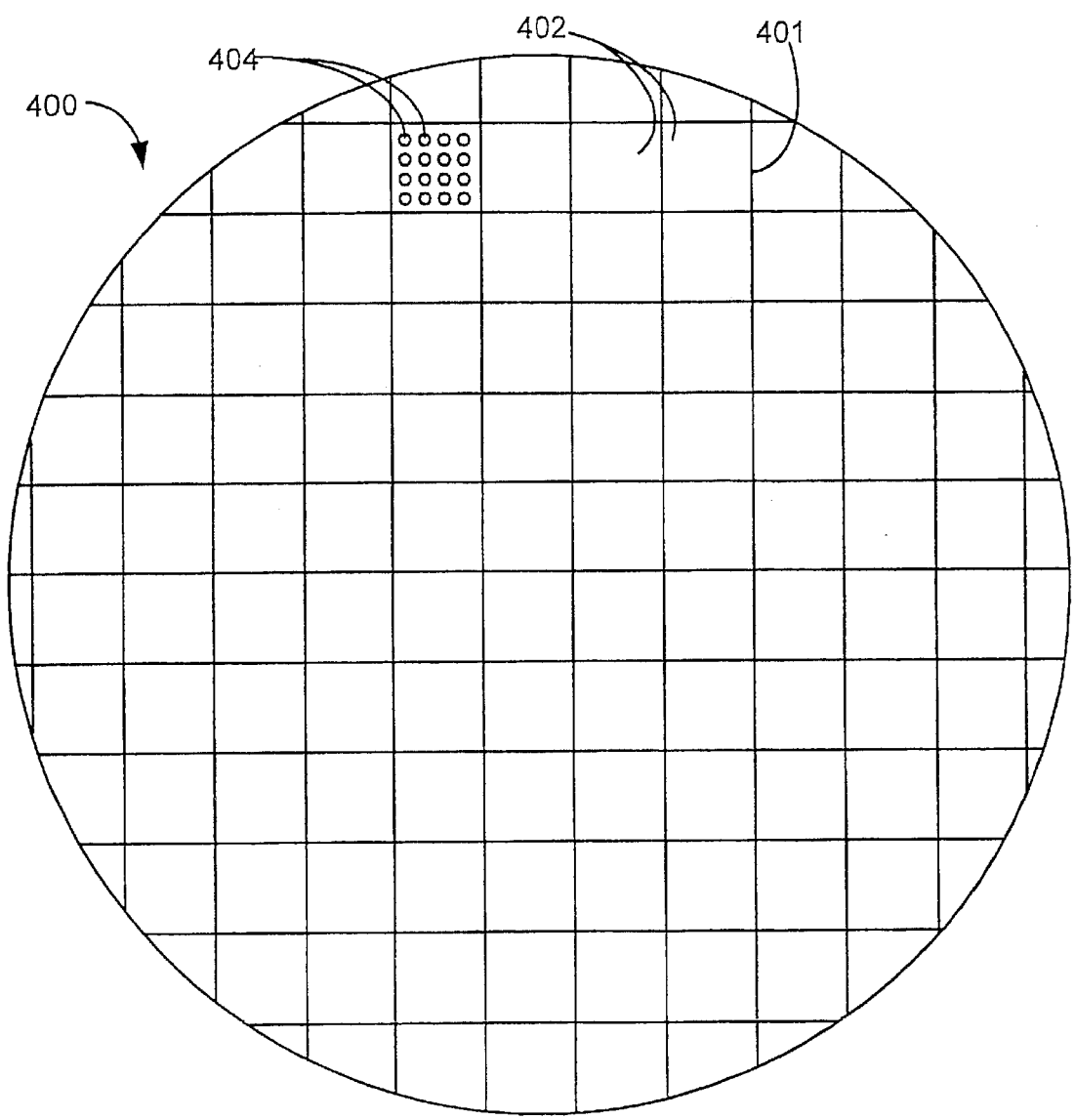
FIG. 4 is a top view of a wafer used in an embodiment of the invention.

To facilitate discussion, FIG. 3 is a flow chart of a method used in a preferred embodiment of the invention. FIG. 4 is a front side view of a wafer 400. The wafer 400 is first processed creating semiconductor chips 402 with semiconductor devices with bond pads 404 to provide electrical connections to the semiconductor devices (step 304). Scribe lines 401 may separate the semiconductor chips 402. Bond pads 404 are provided for each semiconductor chip 402, but are only shown in one semiconductor chip and are not drawn to scale to provide clarity. Hundreds or thousands of chips may be created on a single wafer, however fewer are shown for clarity. The production of semiconductor chips 402 with semiconductor devices with bond pads 404 in a wafer 400 is known in the art.

Figure 5:
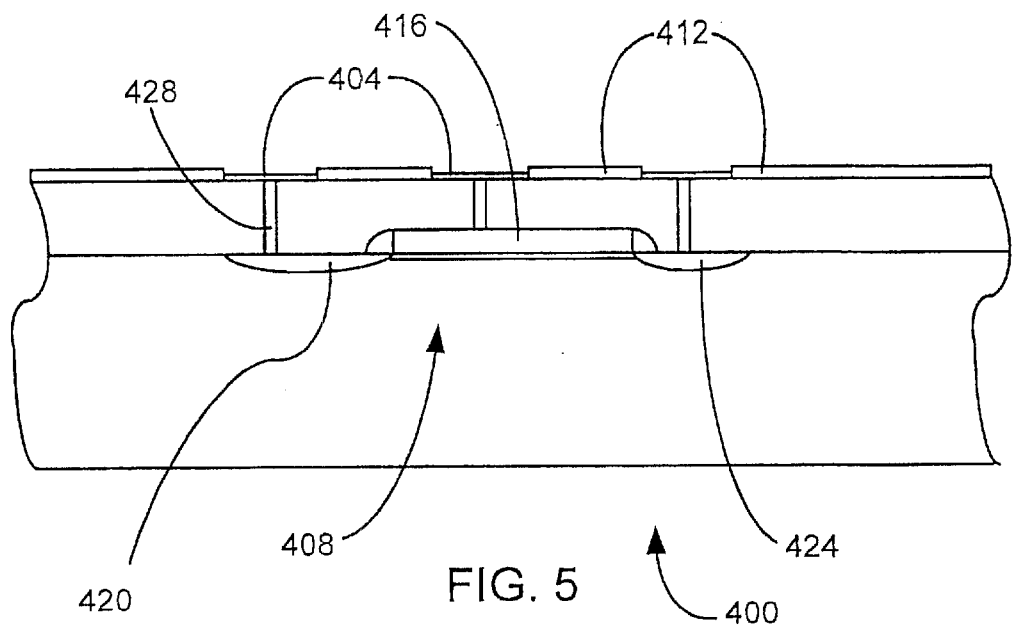
FIG. 5 is a cross-sectional view of a part of the wafer shown in FIG. 4.

FIG. 5 is an enlarged cross-section of part of the wafer 400, with a semiconductor chip with a semiconductor device 408 with a plurality of bond pads 404. The semiconductor device 408 may be a standard transistor with a gate 416, a drain 420, and a source 424. Vias 428 may extend from parts of the semiconductor device to the bond pads 404 on the front side. A passivation 412 layer is placed over the front side of the wafer 400 (step 308). The passivation layer 412 is patterned to expose the bond pads 404 and the scribe lines. Different passivation layers are known in the art. Such passivation layers may be silicon oxide ($SiO_2$) or silicon nitride (SiN). Different methods of providing a patterned passivation layer are known in the art. In a preferred embodiment of the invention, the passivation layer is provided as a layer over the front side of the wafer 400, possibly by vapor deposition of silicon and the subsequent oxidation. The passivation layer may then be patterned by applying a photoresist mask and then etching exposed portions of the passivation layer. In the alternative, a stencil may be used to provide a patterned passivation layer. In the preferred embodiment, the passivation layer is patterned for bumps instead of wirebonds, which means that preferably the opening in the passivation layer above the bond pads is circular or oval instead of square or rectangular.

Figure 6:
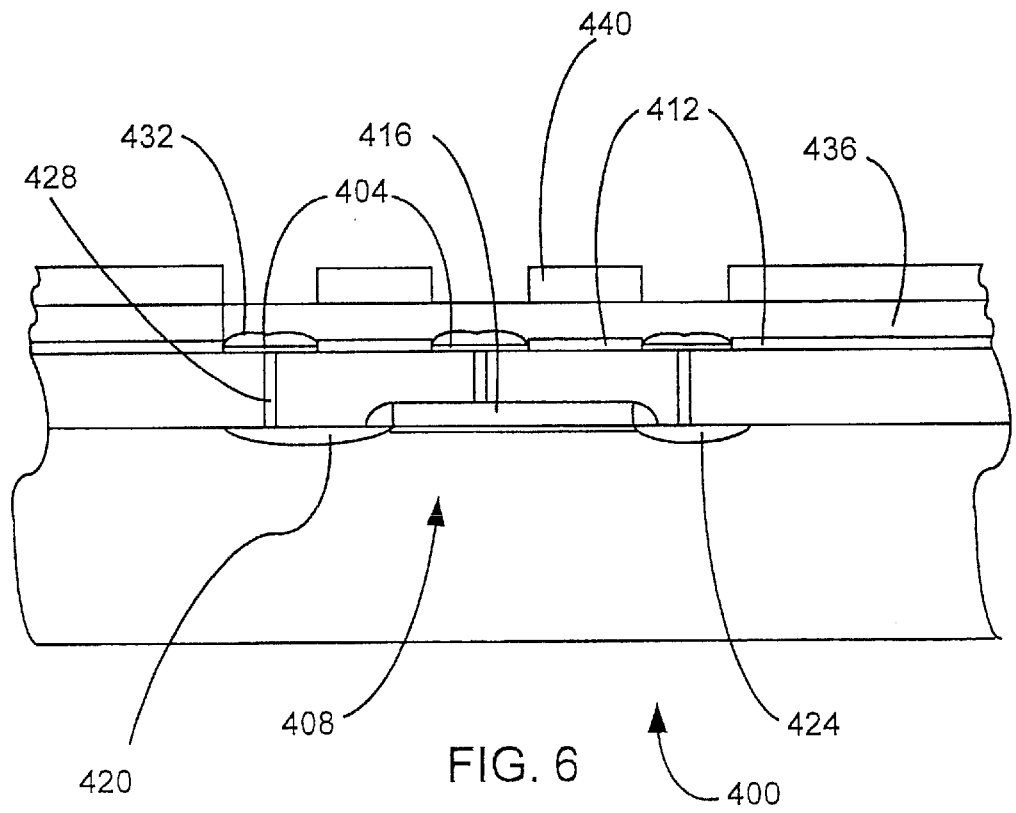
FIG. 6 is a cross-sectional view of the part of the wafer after a mask layer has been applied.

Next an under bump metal (UBM) 432 is provided over the bond pads (step 312), as shown in FIG. 6. Different methods of providing under bump metal deposition are known in the art. One such method is by using electroplating. Usually UBM is sputtered or evaporated. The UBM deposition provides a barrier to protect the bond pads. The UBM deposition also provides better adhesion between solder bumps and the bond pads. Generally, UBM deposition comprises a layered stack of various combinations of metals. Preferable such stacks are two or three layer stacks. Various metal combinations are known in the art to be used for UBM deposition. Such combinations may be aluminum/nickel-vanadium/copper, aluminum/nickel/copper, titanium/copper, chromium/chromium-copper/copper, and nickel/gold. The nickel/gold deposition may be deposited by electroless plating in the preferred embodiment to form nickel/gold UBM.

Figure 7:
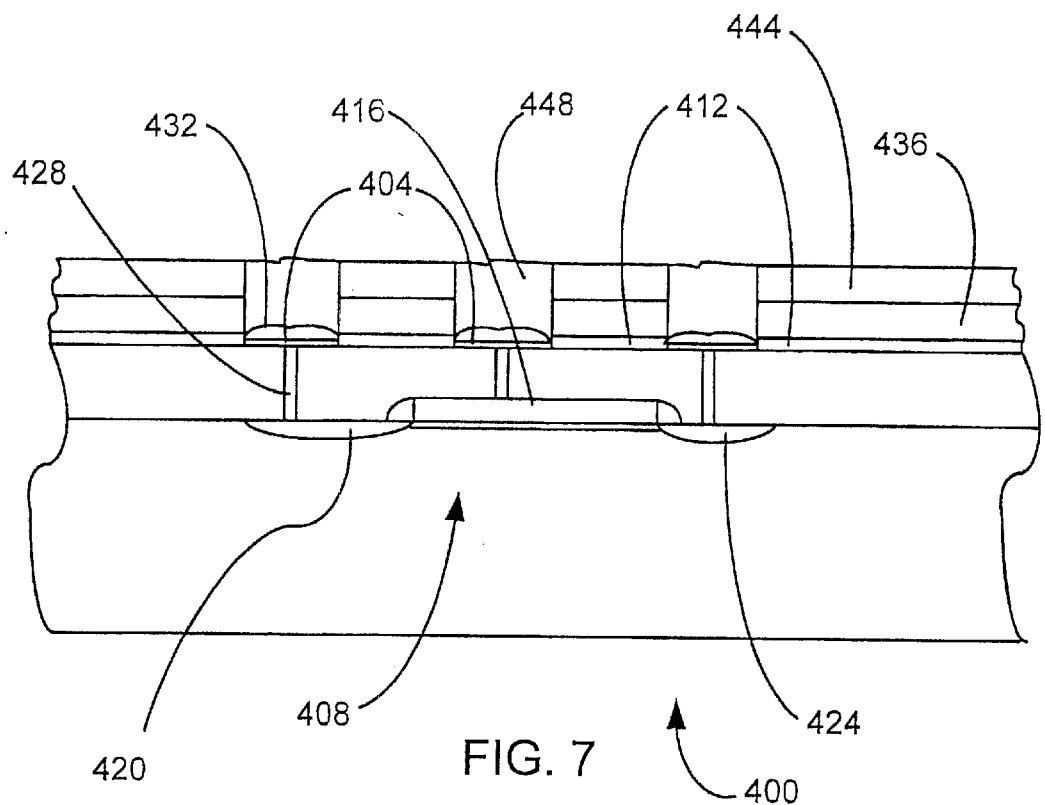
FIG. 7 is a cross-sectional view of the part of the wafer after solder paste has been applied.

A solder mask 436 is then applied over the semiconductor wafer 400 (step 316). The solder mask may be spun on or may be a dry film laminate or a liquid film applied by a squeegee, or a paste applied with a stencil, or an ink material applied by a screen print. In the example illustrated in FIG. 6, the solder mask 436 is a photo-definable solder mask material, which is applied over the front side of the wafer 400. A solder mask stencil 440 may be placed over the wafer 400, leaving uncovered only the UMB plates 432. An ultraviolet (UV) light may be used to expose the photo-definable solder mask material. When the solder mask stencil 440 is removed and the solder mask material is developed, the patterned solder mask 436 (FIG. 7) remains. In another embodiment, a film photoresist mask is placed over the solder mask layer. An exposure of the photoresist and subsequent etching is used to pattern the solder mask. Other methods of patterning the solder mask may be used.

Figure 8:
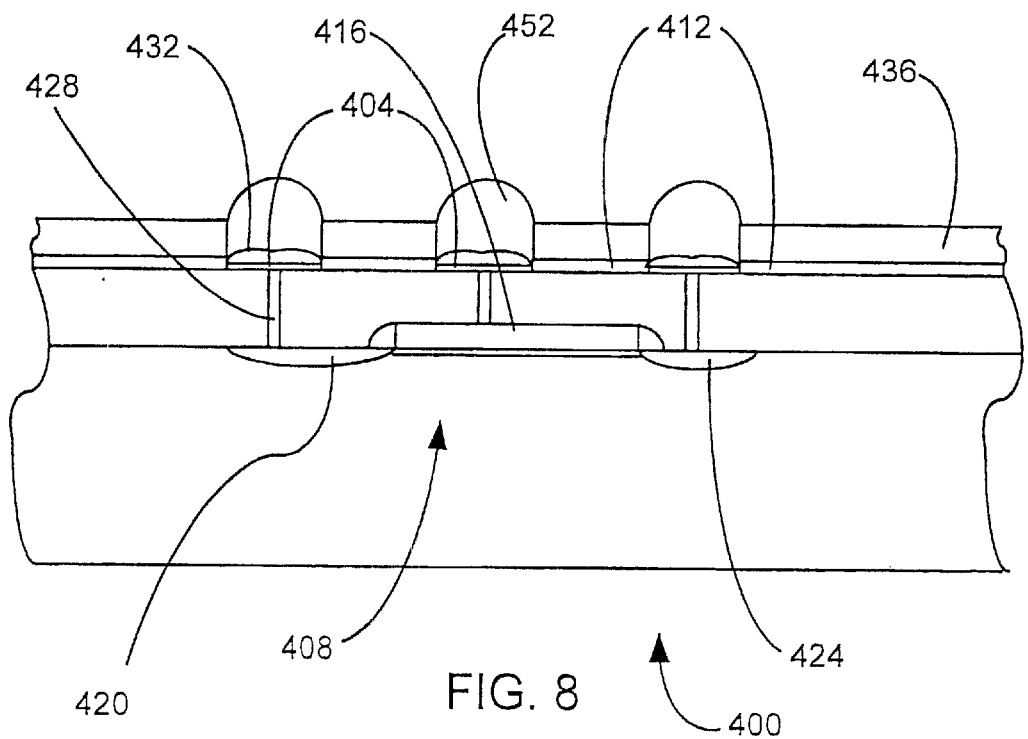
FIG. 8 is a cross-sectional view of the part of the wafer after solder bumps have been formed.

After the solder mask 436 has been patterned the solder bumps are provided (step 320). In the embodiment illustrated in FIG. 7 a solder stencil 444 is placed over the solder mask 436. Solder paste 448 is then applied to fill apertures in the solder stencil 444. This may be done by applying the solder paste with the use of a squeegee. The solder stencil 444 is then removed and the solder paste 448 is melted by reflow to form solder bumps 452, as shown in FIG. 8. The solder paste may be reflowed by placing the wafer in an oven. In the alternative, if a lower volume of solder is required, the solder stencil is not used and the solder paste is applied to fill apertures in the solder mask. The solder paste is then reflowed to form the solder bumps. Alternative methods of forming solder bumps, such as evaporation and electroplating may be used.

Figure 9:
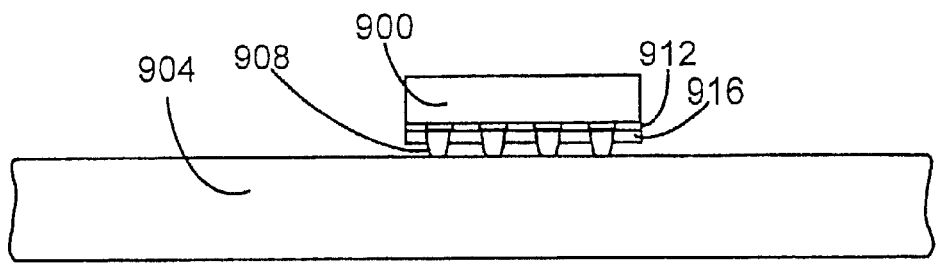
FIG. 9 is a cross-sectional view of a chip mounted on a substrate mounted on a circuit board.
Figure 10:
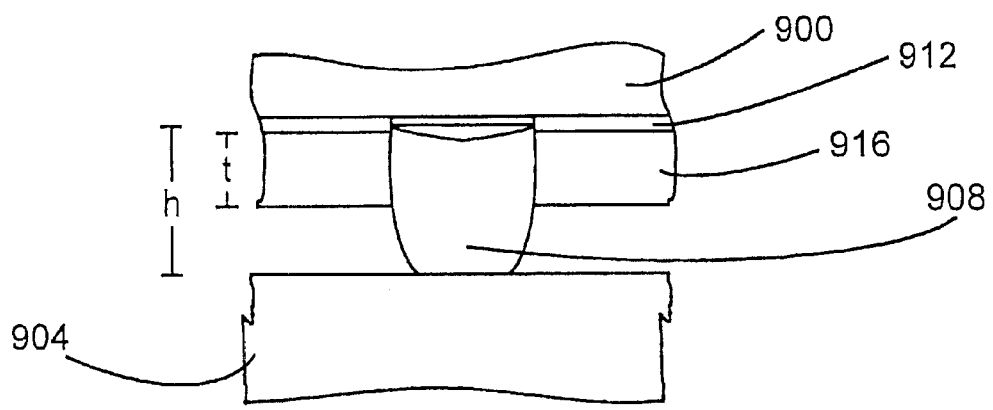
FIG. 10 is an enlarged view of part of the wafer and a solder bump.

The wafer 400 is cut into individual chips (dice) along scribe lines (step 324). Generally, hundreds or thousands of dice may be cut from a single wafer 400. A saw, laser, or etchant may be used to singulate the chips. The chips may then be mounted on a substrate using reflow bonding (step 328). FIG. 9 is illustrates a chip 900 that has been made according to the preferred embodiment of the invention mounted to a substrate 904. The reflow of the solder bumps create solder joints 908, which electrically and physically connect the chip 900 to the substrate 904. FIG. 10 is an enlarged view of a region around a solder bump 908. A passivation layer 912 and a solder mask layer 916 cover the chip 900 and surround the solder bumps 908. Preferably, the thickness t of the solder mask layer 916 is such that the solder mask layer 916 surrounds and is in contact with the solder bumps 908 for at least a quarter the height h of the solder bumps 908. More preferably, the solder mask layer 916 along the thickness extends and is in contact with the solder bumps 908 for at least half the height h of the solder bumps 908. For direct chip attach the substrate 904 is a PC board. In the alternative, the substrate 904 may be a substrate which is mounted on a PC board.

Changes in temperature cause thermal stress between the chip 900 and the substrate 904, which may be absorbed by the solder bumps 908. Thermal stress may cause cracks in the solder bumps 908 close to but usually not adjacent to the UMB. The solder mask layer 916 may help to absorb some of the thermal stress reducing cracking, which may increase the life time of the chip 900 and substrate 904. The solder mask layer 916 may do this by locking the solder bumps in position and giving the solder bumps an uni-body strength, thus improving reliability. The addition of the solder mask to the wafer before singulation provides a faster, easier, and less expensive way of providing the solder mask layer to a chip.

Other electrically conductive connectors may be used in the place of solder bumps. Such electrically conductive connectors may be in the shape of pillars, bumps, and balls. Gold or other conductive material may be used in place of solder. Because the mask layer may extend at least a quarter the way up the conductive connectors, the mask layer may reshape the balls into the form of a bump.

The solder mask layer is preferred, since solder mask may be provided at a thickness preferred in the invention and solder mask is easily patterned and has desired elastic properties, such as a low modulus of elasticity. Solder mask also forms a strong rugged protective layer, which can be patterned on a wafer and may be spun on at an appropriate thickness. Other electrically non-conductive materials with a low modulus of elasticity may be used in place of the solder mask to form a mask layer. Preferably organic materials are used for the mask layer. In addition to solder mask, other organic materials used to form the mask layer may be photoresist or resin. In the preferred embodiment, the mask layer has a thickness of about 5 to 200 microns. More preferably, the solder mask layer has a thickness of about 20 to 100 microns. Most preferably, the solder mask layer has a thickness of about 20 to 70 microns. The mask layer must have physical contact with the electrically conductive connectors. Preferably the thickness of the mask layer is such that the mask layer surrounds and is in contact with the electrically conductive connectors for at least a quarter the height of the electrically conductive connectors. More preferably, the mask layer along the thickness extends and is in contact with the electrically conductive connectors for at least half the height of the electrically conductive connectors, which are solder bumps in the preferred embodiment.

Such chips may be sold before being mounted to a substrate. The mask layer may cause the chip to be more durable. The mask layer on the chip is more convenient and less expensive than placing underfill under each chip after the chip has been mounted on the substrate. This process allows the chip maker to apply a protective coating, whereas underfill must be done by the customer purchasing the chips and is often not practical.

While this invention has been described in terms of several preferred embodiments, there are alterations, modifications, permutations, and substitute equivalents, which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A method for providing a flip-chip, comprising:
    creating a plurality of chips of a wafer, wherein each chip has a plurality of bond pads on a front side of the wafer;
    depositing an under bump metal on each of the plurality of bond pads;
    applying a patterned mask layer over the front side of the wafer, wherein the patterned mask layer provides apertures over the under bump metal,
    forming an electrically conductive connector on each under bump metal, so that the patterned mask layer is in contact with at least a quarter of the electrically conductive connector; and
    singulating the plurality of chips.

2. The method, as recited in claim 1, wherein the mask layer is greater than 20 microns.

3. The method, as recited in claim 2, wherein the mask layer is of an organic material.

4. The method, as recited in claim 2, wherein the mask layer is made of solder mask.

5. The method, as recited in claim 1, wherein the conductive connector is selected from the group consisting of bumps and balls of conductive material.

6. The method, as recited in claim 5, wherein the conductive material is solder.

7. The method, as recited in claim 6, wherein the patterned mask layer has a thickness of at least half of a height the electrically conductive connector.

8. A method for providing a flip-chip, comprising:
    creating a plurality of chips of a wafer, wherein each chip has a plurality of bond pads on a front side of the wafer;
    applying a patterned mask layer over the front side of the wafer, wherein the patterned mask layer provides apertures over the plurality of bond pads, wherein the mask layer is greater than 20 microns, wherein the mask layer is made of solder mask, wherein the step of applying the solder mask over the front side of the wafer, comprises the steps of:
        placing the solder mask on the front side of the wafer;
        patterning the solder mask to expose the plurality of bond pads; and
        curing the solder mask;
    forming an electrically conductive connector on each of the plurality of bond pads, so that the patterned mask layer is in contact with at least a quarter of the electrically conductive connector, wherein the conductive connector is selected from the group consisting of bumps, balls, and pillars of conductive material, wherein the conductive material is solder, wherein the patterned mask layer has a thickness of at least half of a height the electrically conductive connector; and
    singulating the plurality of chips.

9. The method, as recited in claim 8, further comprising the step of placing an under bump metal over the bond pads between the electrically conductive connectors and the bond pads.

10. The method, as recited in claim 9, further comprising the step of placing a passivation layer over the front side of the wafer between the wafer and the mask layer.

11. The method, as recited in claim 10, wherein the step of placing the passivation layer comprises the step of pattering the passivation layer to expose the plurality of bond pads.

12. A method for providing a bumped device, comprising the steps of:
    creating a plurality of devices on a wafer, wherein each device has a plurality of bond pads on a front side of the wafer;
    forming passivation layer over the front side of the wafer;
    patterning the passivation layer to expose the plurality of bond pads;
    depositing an under bump metal on the plurality of bond pads;
    providing a pattern mask layer over the passivation layer, where the patterned mask layer exposes the under bump metal;
    forming electrically conductive bumps on the under bump metal; and
    singulating the bumped devices.

13. The method, as recited in claim 12, wherein the mask layer is of solder mask.

* * * * *